United States Patent [19]
Levy

[11] Patent Number: 5,453,843
[45] Date of Patent: Sep. 26, 1995

[54] METHOD FOR FAST DATA COMPRESSION OF HALF TONE IMAGES WITH THE USE OF PRE-ASSIGNED CODES

[75] Inventor: Jonathan Levy, Ramat Hasharon, Israel

[73] Assignee: National Semiconductor Corporation, Santa Clara, Calif.

[21] Appl. No.: 67,558

[22] Filed: May 25, 1993

[51] Int. Cl.⁶ .............................. H04N 1/41; H04N 1/415
[52] U.S. Cl. .......................... 358/426; 358/429; 358/430; 358/432
[58] Field of Search ................................. 358/429, 430, 358/433, 261.2, 261.1, 261.3, 432, 426

[56] References Cited

U.S. PATENT DOCUMENTS

| | | | |
|---|---|---|---|
| 4,409,623 | 10/1983 | Kobayashi et al. | 358/429 |
| 4,679,094 | 7/1987 | Rutherford et al. | 358/261.1 |
| 4,943,869 | 7/1990 | Horikawa et al. | 358/432 |
| 5,072,302 | 12/1991 | Ronchetti et al. | 358/261.1 |
| 5,148,292 | 9/1992 | Kutaragi | 358/433 |
| 5,163,104 | 11/1992 | Ghosh et al. | 358/261.3 |

*Primary Examiner*—Scott A. Rogers
*Attorney, Agent, or Firm*—Frishauf, Holtz, Goodman, Langer & Chick

[57] ABSTRACT

Data in the form of a sequence of data bits is compressed by separating the data into groups of data bits. A value is derived for the respective groups from the data contained therein. When a group has a derived value equal to the derived value of at least its adjacent group, a pre-assigned control code is used as compressed data. Such compressed data is representative of the data in consecutive groups of data having the same derived value.

34 Claims, 5 Drawing Sheets

METHOD FOR FAST DATA COMPRESSION OF HALF TONE IMAGES WITH THE USE OF PRE-ASSIGNED CODES

BACKGROUND OF THE INVENTION

The present invention is directed to a data compression technique and, in particular, to the compression of data corresponding to gray scale images generated with, for example, a facsimile machine.

Although the data compression technique of the present invention is useful in a variety of applications, it will be discussed herein with particular reference to the environment of facsimile machines which generate images by scanning original images, transmitting and/or receiving image-related data over telephone lines, and outputting reproduced images.

Conventional facsimile machines use one of three compression schemes called "Modified Huffman" (MH), "Modified Read" (MR), and "Modified Modified Read" (MMR). Each scheme converts a run length (i.e. an uninterrupted sequence of either black or white pixels) of either black or white pixels into a pre-assigned code word. The MH scheme utilizes 92 such code words for each of the black and white pixels, the first 10 of which are shown in Table 1 by way of example.

TABLE 1

| Run Length | White Code Word | Black Code Word |
|---|---|---|
| 1 | 000111 | 010 |
| 2 | 0111 | 11 |
| 3 | 1000 | 10 |
| 4 | 1011 | 011 |
| 5 | 1100 | 0011 |
| 6 | 1110 | 0010 |
| 7 | 1111 | 00011 |
| 8 | 10011 | 000101 |
| 9 | 10100 | 000100 |
| 10 | 00111 | 0000100 |

The one-dimensional, horizontal compression carried out by MH coding is improved upon with the MR and MMR schemes which are two-dimensional by virtue of performing vertical compression. Briefly stated, MR correlates the current line of pixels being coded with the line just above it. If, for example, a run length of "0"s in the current line coincides with a run length of "0"s in the previous line, only a single bit will suffice to encode the entire run length.

Regarding the MR encoding scheme, when the fax signal is distorted by a noise pulse (e.g. due to lightning or a switching transient), errors are made in the pattern of black and white dots in the received copy. To prevent this incorrect pattern from propagating down the page, an MH coded line is sent periodically. One approach, known as MR-2, compresses every other line using MR encoding (i.e. 1 MH line and 1 MR line). Another approach, known as MR-4, uses MH encoding every fourth line (i.e. 1 MH line and 3 MR lines). In the approach known as MMR, MH encoding is used only for the first line of a page, and all the remaining lines are compressed with MR encoding. In the discussion below, "MR" refers to the MR-2 approach.

Details on MH and MR can be found in McConnell, Bodson, and Schaphorst, "FAX: Digital Facsimile Technology & Applications" Artech House, Inc., 1989, Chapter 2.

The efficiency of the three schemes is usually measured on standard images, such as "CCITT chart #1", "CCITT chart #2", and "CCITT chart #3". The page storage sizes in "Standard Resolution" (i.e. 1728×1100 pixels), before and after compression, are shown in Table 2.

TABLE 2

| Page | Uncompressed (bytes) | MH (bytes) | MR (bytes) | MMR (bytes) |
|---|---|---|---|---|
| CCITT #1 | 237,600 | 20,951 | 18,708 | 14,455 |
| CCITT #2 | 237,600 | 47,619 | 40,659 | 31,663 |
| CCITT #3 | 237,600 | 128,280 | 95,553 | 60,879 |

These compression schemes result in good compression for pages that contain lines with relatively long "run lengths", such as contained in a page of text. The compression can produce efficient coding of these run lengths. For example, a run length of 10 consecutive white pixels would be encoded by 5 bits (00111 per Table 1) in the MH encoding scheme, resulting in a compression ratio of 2.0.

Such conventional data compression schemes suffer from at least the following two drawbacks. Firstly, they do not have the capability to satisfactorily compress complex pages (e.g. "half tone") because little, if any, storage space is actually saved by the compression scheme. Secondly, the implementation of these schemes in a software based facsimile system, such as NSFAX available from National Semiconductor Corporation, is problematic because they require a high level of processor power. These drawbacks are explained in greater detail below.

Compression of gray scale images:

Gray scale images, when converted to half tone images, are characterized, in contrast to most simple text pages, by very short run lengths, typically one to 4 bits long.

As one can see from Table 1, if the run lengths are more than 4 bits in length, the MH encoding will save space, because the encoding codes are 4 bits in length or less. On the other hand, in complex gray scale images, where it is common to have areas with very short run lengths (both black and white), the MH encoding can actually increase the storage requirements. Table 3 shows a typical gray scale example:

TABLE 3

| Original Bitmap image | MH encoding | # of Original bits | # of MH bits |
|---|---|---|---|
| 0011010111 | 01111100011101000011110 | 10 | 23 |

The problem of obtaining a "compressed" file which is usually bigger than the un-compressed original is quite common for gray scale images. MR and MMR compression schemes, which usually achieve better compression than MH, do not solve this problem either, and can even produce worse results. Table 4 shows the file size as well as compressed sizes for three gray scale images (which are attached in the appendix).

TABLE 4

| File | File size | MH | MMR |
|---|---|---|---|
| "PENCIL" | 237,600 | 822,133 | 608,148 |
| "FAMILY" | 237,600 | 463,367 | 516,358 |
| "FROG1" | 237,600 | 372,751 | 466,477 |

Performance:

The standard MH, MR and MMR compression algorithms operate based on a determination of run lengths of bits to encode the bit pattern in a more efficient manner. To do so, the basic operations carried out on the input bitmap generated from a scan of the original image, and the output of compressed data, are done on the basis of bit boundaries. In other words, a typical algorithm will count the number of "0" bits in a row and, according to the result, will substitute a unique, pre-designated bit pattern (i.e. compression code) in the output (see the encoding in Table 1 for some examples). While this method may not be problematic when implemented in hardware, it is very time consuming when done in software. This is mainly due to the fact that processors waste a lot of processing power in connection with aligning operations to bit boundaries. Stated another way, processors typically communicate in multiples of a preset number of bits, such as 8 bit bytes. However, the bit boundary at the end of a run length can include any number of bits, yet the processor must transfer it in terms of bytes. For this reason as well as other reasons, such as time needed to repeatedly access the memory, more instructions being required, slow shift instructions needed to align the bits, and a slow determination of where the bits change color, efficiency is lost with a software implementation of an encoding scheme for half tone images.

This performance limitation becomes especially troublesome in connection with obtaining what may be known as a "quick scan". This term refers to a technique by which a person sending a facsimile can insert a document to be scanned, and the resulting data is retained in a memory for later use as transmission is initiated. Once the scanning and retention are completed, the actual steps of sending the document (e.g. dialing, handshaking and transmission) are carried out at whatever speed is appropriate for the equipment being used. However, the user is freed from the task because the facsimile does the transmission on its own by retrieving the stored data. This is different from the earlier-developed, slower and more laborious approach of sending a facsimile with the speed of scanning a document being governed by the transmission speed which is normally considerably slower. It is quite reasonable to expect that a "quick scan" session requires no more than a few seconds even for a complex, gray scale image.

The data compression for a "quick scan" is done in real time as the original is being scanned and with no intermediate storage of the data except that the previous line must be stored for use as a reference to perform MR encoding. Acceptable speed for "quick scan" is available only with specially designed hardware which involves a longer development time for a product, requires more board space, and adds to the cost.

Table 5 provides timing for compressing some of the above-mentioned pages with MH encoding (as measured using NSFAX):

TABLE 5

| File | Time (sec) |
| --- | --- |
| CCITT3 | 7.5 |
| FAMILY | 24.7 |
| PENCIL | 43.5 |

It is quite evident that the length of time required is more than one would find reasonably convenient.

SUMMARY OF THE INVENTION

One object of the present invention is to provide an improved data compression technique..

Another object of the present invention is to provide a data compression technique which provides effective data compression even for relatively short run lengths of "1's" and "0's" such as are found, for example, in connection with black and white pixels on gray scale images.

A further object of the present invention is to provide a technique which provides faster data compression, particularly in gray scale images.

One other object of the present invention is to provide a technique which makes it possible to perform "quick scan" without special hardware.

Still another object of the present invention is to provide a technique which makes it possible to perform efficient data compression with relatively low performance processors.

Yet another object of the present invention is to provide a data compression technique that provides faster compression which requires less processor power so as to make it possible to perform real-time data compression in the background without affecting the foreground response time (e.g. in a PC, 0 where the host compresses an image while the user is doing something else).

These and other objects are attained in accordance with one aspect of the present invention directed to a method for compression of data in the form of a sequence of data bits. The data bits are separated into groups of data bits. A value for each of the groups of data bits is derived from the data bits in such group and a determination is made whether the value derived for a particular group of data bits is equal to that of at least one group adjacent to the particular group. If so, compressed data is transferred which is representative of data in the particular group and in the at least one group consecutive with the particular group and having the same derived value.

Another aspect of the present invention is directed to a method for compression of data in the form of a sequence of data bits wherein the data bits are separated into groups of data bits. A plurality of categories are provided for values of the groups that are derivable from the data bits in the respective groups. The categories are indicative of the type of data in such groups. For each of such categories, a preassigned set of control codes is provided which is indicative of at least one of (a) the data contained in such groups, and (b) the number of consecutive groups having the same derived value. Compressed data is substituted for data bits in a plurality of consecutive groups of data bits. The compressed data includes one of the set of pre-assigned codes which corresponds to the occurrence of consecutive groups of data bits that fit within the same one of the provided categories.

A further aspect of the present invention is directed to an apparatus for compression of data in the form of a sequence of data bits that includes means for separating the data bits into groups of data bits, and means for determining a value for each of the groups of data bits derived from the data bits in such group. A means is provided for determining whether the value derived for a particular group of data bits is equal to that of at least one group adjacent to the particular group, and transfer means responsive to the determining means transfers compressed data representative of data bits in the particular group and in the at least one group consecutive with the particular group and having the same derived value.

Still another aspect of the present invention is directed to an apparatus for compression of data in the form of a sequence of data bits having means for separating the data bits into groups of data bits. A means provides a plurality of categories for values of the groups derivable from the data bits in the respective groups. The categories are indicative of the type of data in such groups. A means is provided for pre-assigning a set of control codes, for each of such categories, indicative of at least one of (a) the data contained in such groups, and (b) the number of consecutive groups having the same derived value. A means substitutes for data bits in a plurality of consecutive groups of data bits compressed data that includes one of the set of pre-assigned codes which corresponds to the occurrence of consecutive groups of data bits that fit within the same one of the provided categories.

DETAILED DESCRIPTION OF THE INVENTION

A key aspect of the invention is that it treats the bitmap derived from scanning an original image as a collection of 8 bit bytes, each having a decimal value in the range of 0 to 255 (or a hexadecimal value in the range of 0×0 to 0×FF), where 0 is represented by eight "0"s, and 255 by eight "1"s. This is contrary to the above-described facsimile compression schemes that regard the bitmap as a series of "1" and "0" bits, and uses the run length of consecutive "0"s or "1"s for the compression.

The 256 different byte values are divided in accordance with the invention into the following groups:

(1) Two "common" bytes (usually selected to be the all "0" byte called "white" and the all "1" byte called "black" hereinbelow), (2) 10 "rare" bytes, to be used as control bytes for the compression scheme (they can be selected by default according to known statistics, or selected dynamically, per page or per line), and (3) all other bytes.

A compression table with 256 entries is provided for the algorithm. Each byte from the bitmap data is used as an index into this table. For example, a byte with a value of 203 will reference entry number 203 in this table. It is not necessary to set forth the entire compression table. Instead, it can be summarized in terms of the fact that it categorizes each byte value examined into one of the following 13 categories, or types:

| | |
|---|---|
| COMPRESS_WHITE: | this byte is one of the two "common" bytes |
| ESC_W2: | this control byte is used to mark two consecutive "whites" |
| ESC_W3: | this control byte is used to mark three consecutive "whites" |
| ESC_WN: | this control byte is used to mark N consecutive "whites" |
| COMPRESS_BLACK: | this byte is the other "common" byte |
| ESC_B2: | this control byte is used to mark two consecutive "blacks" |
| ESC_B3: | this control byte is used to mark three consecutive "blacks" |
| ESC_BN: | this control byte is used to mark N consecutive "blacks" |
| ESC_03: | this control byte is used to mark three identical consecutive bytes |
| ESC_04: | this control byte is used to mark four identical consecutive bytes |
| ESC_ON: | this control byte is used to mark N identical consecutive bytes |
| ESC_ESC: | this control byte is used to indicate that the following byte is a regular byte, even though it is equal to one of the control bytes |
| COMPRESS_OTHER: | this is one of the remaining 244 bytes |

Several entries from this table are shown by way of example in Table 1.

TABLE 1

| | Compression/Decompression | |
|---|---|---|
| Hexadecimal Value | Category | Code |
| 0 | COMPRESS_WHITE | 1 |
| 1 | COMPRESS_OTHER | 3 |
| 2 | COMPRESS_OTHER | 3 |
| * | * * * | * |
| 1b | COMPRESS_OTHER | 3 |
| 1c | ESC_W2 | 4 |
| 1d | COMPRESS_OTHER | 3 |
| * | * * * | * |
| 3b | COMPRESS_OTHER | 3 |
| 3c | (ESC_W3) | 5 |
| 3d | COMPRESS_OTHER | 3 |
| * | * * * | * |
| 72 | COMPRESS_OTHER | 3 |
| 73 | ESC_B2 | 7 |
| 74 | COMPRESS_OTHER | 3 |
| * | * * * | * |
| 8d | COMPRESS_OTHER | 3 |
| 8e | ESC_B3 | 8 |
| 8f | COMPRESS_OTHER | 3 |
| * | * * * | * |
| 97 | COMPRESS_OTHER | 3 |
| 98 | ESC_BN | 9 |
| 99 | COMPRESS_OTHER | 3 |
| * | * * * | * |
| 9b | COMPRESS_OTHER | 3 |
| 9c | ESC_03 | 10 |
| 9d | COMPRESS_OTHER | 3 |
| * | * * * | * |
| c5 | COMPRESS_OTHER | 3 |
| c6 | ESC_4 | 11 |
| c7 | ESC_ON | 12 |
| c8 | COMPRESS_OTHER | 3 |
| * | * * * | * |
| e2 | COMPRESS_OTHER | 3 |
| e3 | ESC_WN | 6 |
| e4 | COMPRESS_OTHER | 3 |
| * | * * * | * |
| e6 | COMPRESS_OTHER | 3 |
| e7 | ESC_ESC | 13 |
| e8 | COMPRESS_OTHER | 3 |
| * | * * * | * |
| ff | COMPRESS_BLACK | 2 |

For each byte read from the bitmap data, Table 1 is consulted, the value of the byte identifies it as belonging to one of four groups, and appropriate action is taken, as follows.

If the byte corresponds to COMPRESS_WHITE, determine how many consecutive bytes are the same:
   If it is a single byte, transfer it unchanged;
   If there are 2 consecutive bytes, transfer the control byte, ESC_W2;
   If there are 3 bytes, transfer the control byte ESC_W3;
   If there are more than 3 bytes but less than 255 bytes, transfer the control byte ESC_WN, followed by a byte representing the number N of consecutive bytes;
   If the number is greater or equal to 255, split it into groups of 255 and a remainder of fewer consecutive bytes.
If the byte corresponds to COMPRESS_BLACK, the procedure is similar to the case of COMPRESS_WHITE, but the respectively corresponding control bytes used are ESC_B2, ESC_B3, and ESC BN.
If the byte corresponds to COMPRESS_OTHER, determine how many consecutive bytes (the data in the bytes being referred to below as "BYTES") are the same:
   If there are less than 3 BYTES, transfer them unchanged;
   If there are 3 consecutive BYTES, transfer the control byte ESC_03, followed by the BYTE;
   If there are 4 consecutive BYTES, transfer the control byte ESC_04, followed by the BYTE;
   If there are more than 4 BYTES but less than 255, transfer the control byte ESC_ON, followed by the number N of consecutive bytes, and finally followed by the BYTE;
   If the number is greater than 255, split it into groups of 255 and a remainder of fewer consecutive BYTES.
If the BYTE corresponds to one of the 10 control BYTES transfer the control byte ESC_ESC followed by the BYTE.

The decompression is performed using the conversions contained in Table 1. Table 1 is consulted for each byte received as compressed data and, depending on its value, the output (to the un-compressed bitmap) is determined as follows.
   If it is of type ESC_W2, transfer two "white" bytes.
   If it is of type ESC_W3, transfer three "white" bytes.
   If it is of type ESC_WN, read the next byte which contains the count N, and transfer the number of "white" bytes equal to N.
   If it is of type ESC_B2, transfer two "black" bytes.
   If it is of type ESC_B3, transfer three "black" bytes.
   If it is of type ESC_BN, read the next byte which contains the count N, and transfer the number of "black" bytes equal to N.
   If it is of type ESC_03, read the next byte, and transfer that BYTE three times.
   If it is of type ESC_04, read the next byte, and transfer that BYTE four times.
   If it is of type ESC_ON, read the next byte to obtain the BYTE data, then read the following byte which is the value of N, and transfer the number of BYTE's equal to N.
   If it is of type ESC_ESC, read the next byte and transfer that BYTE.

Figure 1A:
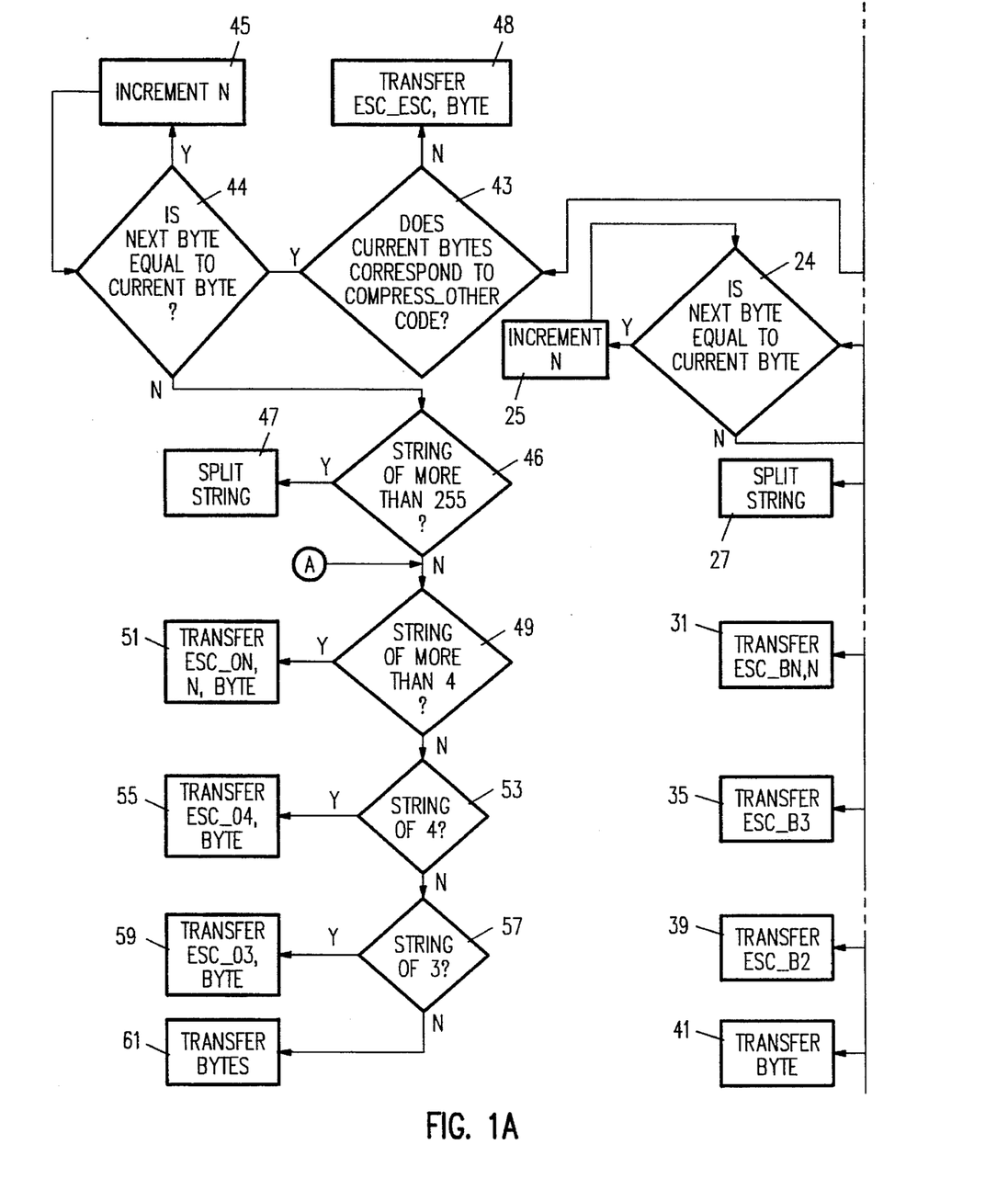
FIG. 1 is a flow chart showing a data compression technique.
Figure 1B:
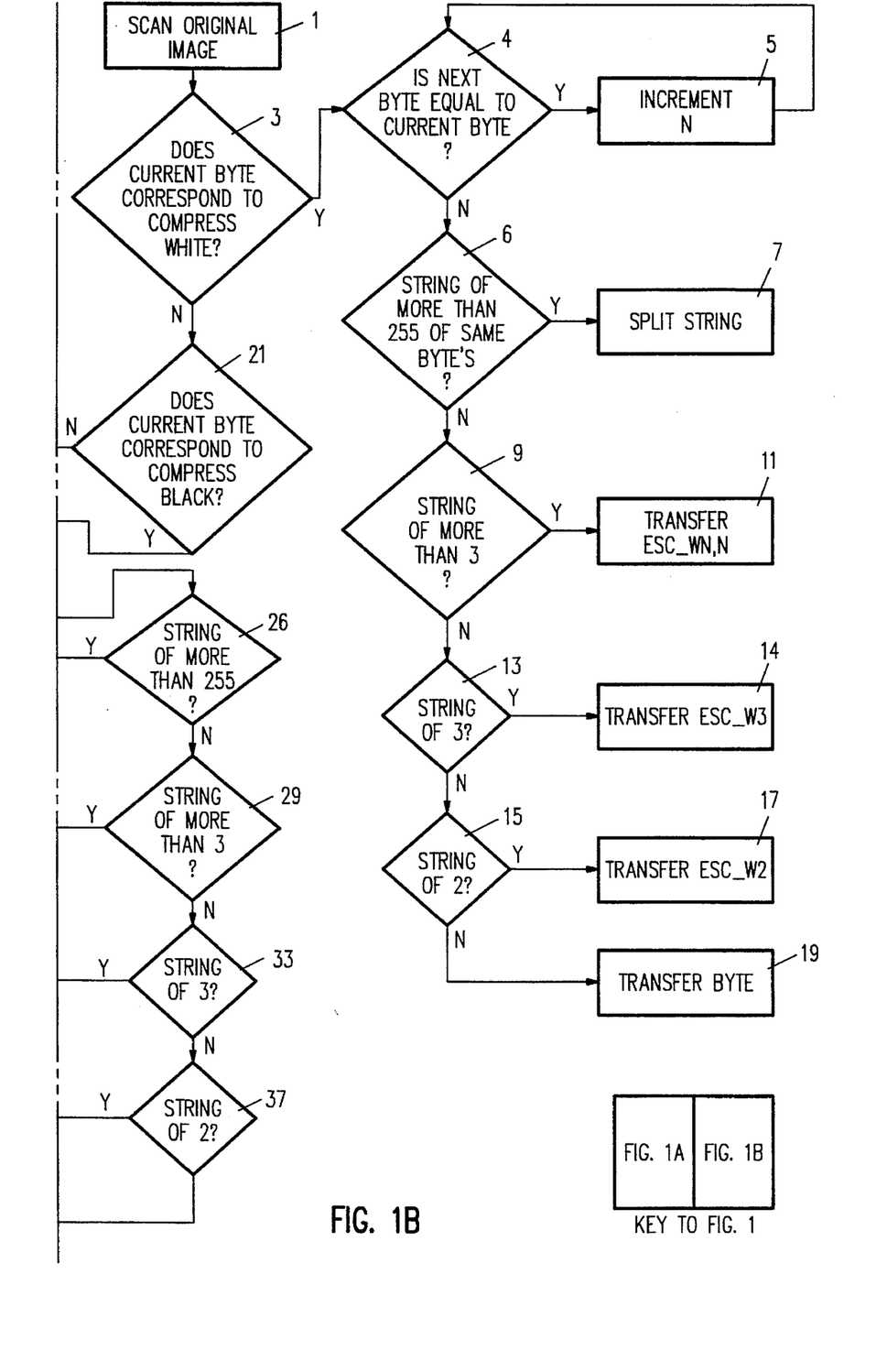

A more detailed explanation of the present invention is provided in connection with the compression flowchart depicted in FIG. 1. The bitmap data is obtained from a scan of the original image, as per step 1. The resulting bitmap data is checked per step 3 to examine whether it corresponds to COMPRESS_WHITE. If it does, then step 4 compares the current BYTE with the next BYTE and, if they are the same, step 5 increments a counter to increase the value of N by one. (The value of N has been reset to 1 before the counting starts, although this step is not shown because it is self-apparent and to streamline the explanation.) Thus, the value of N at the conclusion of step 5 is indicative of the number of bytes in a string of consecutive, identical bytes. Step 5 loops back to step 4 to continue running the same check with the succeeding bytes until a byte is found having different BYTE data. When this occurs, step 5 directs the operational flow to step 6 to determine whether the string of consecutive bytes of "whites" counted up to that point is equal to more than 255.

If it is determined that the string is at least 255 bytes in length, then step 7 splits the string into groups of 255 bytes, with a remainder if any. This is done in accordance with the details provided in FIG. 3 and explained further below.

If the answer to step 6 is negative because the string is below 255, step 9 checks whether the number of bytes in the string is more than 3. If so, then step 11 transfers the control byte ESC_WN which, as explained above, indicates that a certain number N of consecutive WHITES is being encoded. After the control byte is transferred, the next byte is inserted with a value of N.

If the answer to step 9 is negative, step 13 checks whether the number in the string is 3. If it is, then step 13 transfers the control byte ESC_W3, per step 14. If the answer to step 13 is negative, step 15 checks whether the number in the string is only 2. If it is, then control byte ESC_W2 is transferred per step 17. If, however, the answer to step 15 is negative, then this can only mean that the current byte is the only byte in the string. Consequently, the BYTE data is transferred as is, per step 19, since there is no point in encoding it.

Returning to step 3, if the check yields a negative answer, then step 21 determines whether the current BYTE corresponds to the COMPRESS BLACK control code. If it does, then steps 24, 25, 26, 29, 33 and 37 correspond, respectively, to steps 4, 5, 6, 9, 13 and 15, but with the exception that they indicate the presence of "blacks" in the bitmap rather than "whites". Also, steps 27, 31, 35, 39 and 41 correspond, respectively, to step 7, 11, 14, 17 and 19.

If step 21 yields a negative result, then step 43 checks whether the current BYTE corresponds to a COMPRESS_OTHER code. If the result is negative, then the current BYTE can only be one of the ten control codes. In such a case, step 48 transfers the control byte ESC_ESC followed by the BYTE. If a positive result is produced by step 43, it indicates that the current byte is not a "white" "black" or "rare" byte. Thus, it is indicative of the fact that the current BYTE is a regular, non-control byte. Steps 44–46 keep track of the number of bytes in a string and, when the string is interrupted, check whether the number in the string is more than 255. If so, then step 47 splits the string in the manner described below with reference to FIG. 3. If step 46 yields a negative result, then step 49 checks whether the number in the string is more than 4. If it is, then step 41 transfers a control byte ESC_ON, with this control byte being immediately followed by a byte having a value equal to N, and then by the BYTE itself.

If step 49 yields a negative result, then step 53 checks whether the number in the string is 4 and, if it is, then step 55 transfers control byte ESC$_{13}$ 04 followed immediately by the BYTE. If, however, step 53 yields a negative result, then step 57 checks whether the number in the string is just 3. If it is, then step 59 transfers the control byte ESC_03 followed immediately by the BYTE. However, if the number in the string is below 3, then step 61 transfers the one or two BYTE's unchanged.

Figures 2, 3:
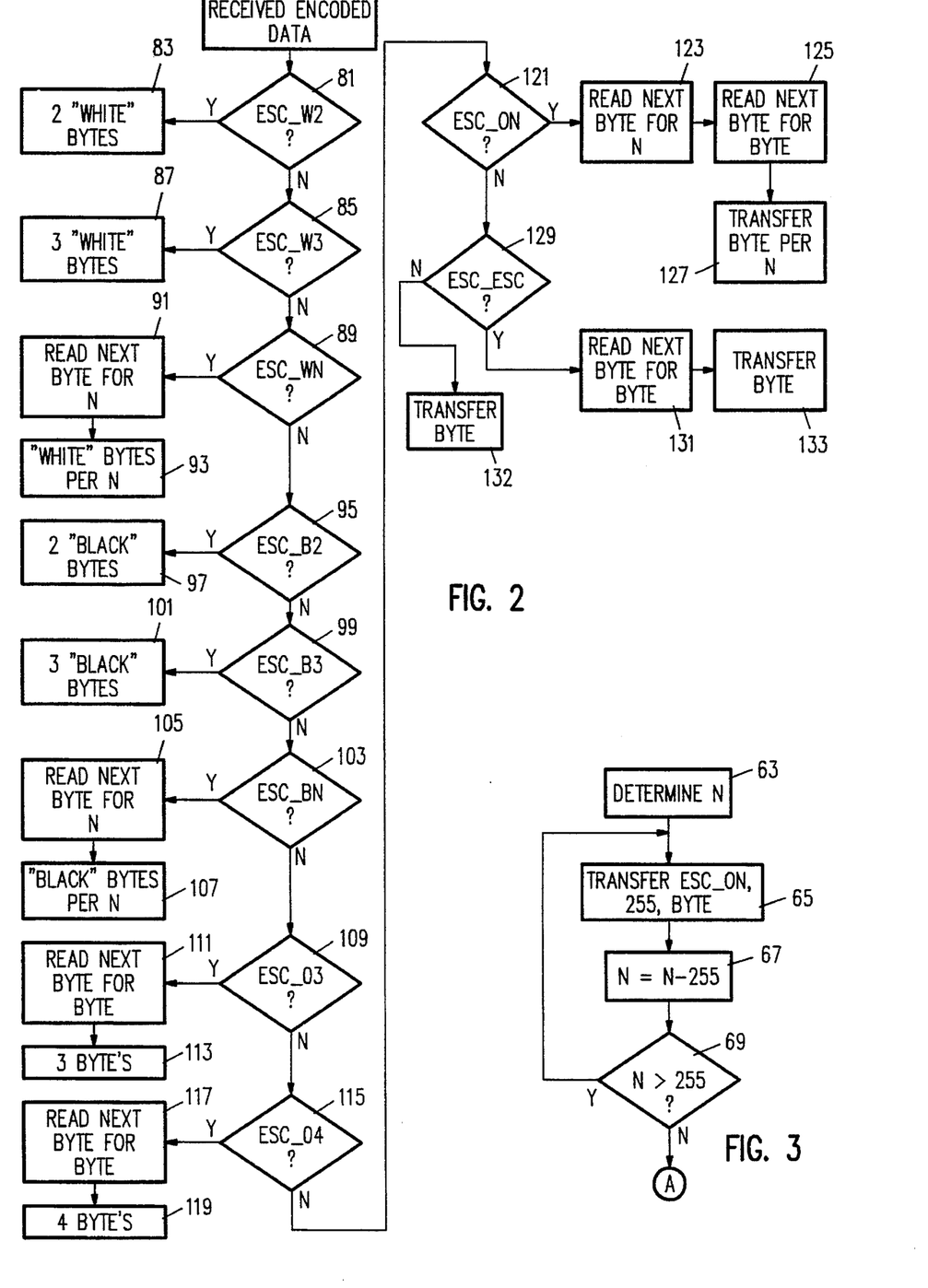
FIG. 2 is a flow chart showing a technique for decompressing the data compressed per FIG. 1.
FIG. 3 is a breakdown of a "split string" operation shown in FIG. 1.

Turning now to FIG. 3, the split string operation is described in connection specifically with respect to step 47. Step 63 determines the number N in the string. The ESC_ON control byte, a byte having a value of 255, and BYTE are then transferred, per step 65. Thus, the 255 identical, consecutive bytes are compressed into only three bytes. Step 67 then reduces the value of N by the 255 bytes that were just compressed for transfer in encoded form, and step 69 checks whether more than 255 bytes remain in the string. If so, then the flow loops back to step 65. If 255 bytes or less remain, then the flow is directed back to the input of step 49 in FIG. 1 so that the appropriate encoding is carried out in connection with steps 49, 51, 53, 55, 57, 59 and 61 described above.

Although FIG. 3 has been described specifically with respect to split string 47 which is universally applicable to a byte of any value, a similar operation is carried out with respect to the split string steps 7 and 27 which apply to "whites" and "blacks" respectively. However, in the transfer step corresponding to step 65, it is not necessary to do the encoding with three bytes since only two suffice. More specifically, for split string step 7, only the bytes ESC_WN and N need to be transferred because the BYTE is already known to be "0"s. Likewise, for split string step 27, the bytes transferred will be ESC_BN and N.

The encoded data is transferred by the modem from the transmitting end to the receiving end where it is decompressed. The above-discussed compression table can also be used for decompression. Thus, if a byte having a certain value is received, the meaning of that value is looked up in the Table. The next step is to convert the byte, based upon the ascertained meaning, into decompressed data. This task of decompression can also be described with an algorithm of the sequential steps depicted in FIG. 2. More specifically, step 81 checks whether the data byte corresponds to control byte ESC_W2. If so, then this control byte is substituted by two "white" bytes for the decompression, as per step 83. If step 81 yields a negative result, then step 85 will check whether the current byte being decompressed corresponds to control byte ESC_W3. If so, then three "white" bytes are substituted for it, as per step 87. If step 85 yields a negative result, then step 89 will check whether the current byte corresponds to control byte ESC_WN. If it does, then step 91 will also read the next byte to obtain a value of N. Then, step 93 decompresses the control byte ESC_WN by substituting for it the number of "white bytes" equivalent to N. If, however, step 89 yields a negative result, then step 95 checks whether the current byte corresponds to control byte ESC_B2. If it does, then step 97 decompresses this byte by substituting two "black" bytes for it. If step 95 yields a negative result, then step 99 checks whether the current byte corresponds to control byte ESC_B3. If so, then step 101 substitutes three "black" bytes for it.

If step 99 yields a negative result, then step 103 checks whether the current byte corresponds to control byte ESC_BN. If so, then step 105 reads the next byte to obtain a value for N. This value is used by step 107 to decompress the control byte ESC_BN by substituting for it a number N of "black" bytes.

If step 103 yields a negative result, then step 109 checks whether the current byte corresponds to control byte $ESC_{13}$ 03. If it does then step 111 reads the next byte to obtain the BYTE data. Then, step 113 substitutes for this control byte three BYTE's.

If step 109 yields a negative result, then step 115 checks whether the current byte corresponds to control byte $ESC_{13}$ 04. If it does, then step 117 reads the next byte to obtain the BYTE data which is used by step 119 to decompress the control byte $ESC_{13}$ 04 into 4 BYTE's.

If step 115 yields a negative result, then step 121 checks whether the current byte corresponds to control byte ESC_ON. If it does, then step 123 reads the next byte to derive a value for N. Step 125 then reads the following byte to obtain a BYTE data, and step 127 decompresses the control byte ESC_ON by substituting for it N of the BYTE's.

If step 121 yields a negative result, then step 129 determines whether the current byte corresponds to control byte ESC_ESC. If it does, then the next byte is read to obtain the BYTE data, per step 131, and step 133 transfers the BYTE unchanged. What the sequence of steps 129, 131 and 133 is aimed at is to deal with the situation of the current byte having BYTE data which happens to correspond with the binary value of the ESC_ESC control code. As has been explained above, all of the control bytes are "rare" bytes selected based on a statistical analysis so as to correspond to the 10 bytes which have the lowest possibility of appearing in the image. However, clearly there is a finite possibility that any control byte will appear in the bitmap data. Consequently, there must be some mechanism for accurately transferring this information nevertheless. This is what steps 129, 131 and 133 accomplish.

If step 129 yields a negative result, this is indicative of the fact that the byte was not compressed, as is the case with steps 19, 41 and 61 in FIG. 1. Thus, the current byte is merely transferred as its own BYTE data, as per step 132.

Figure 4A:
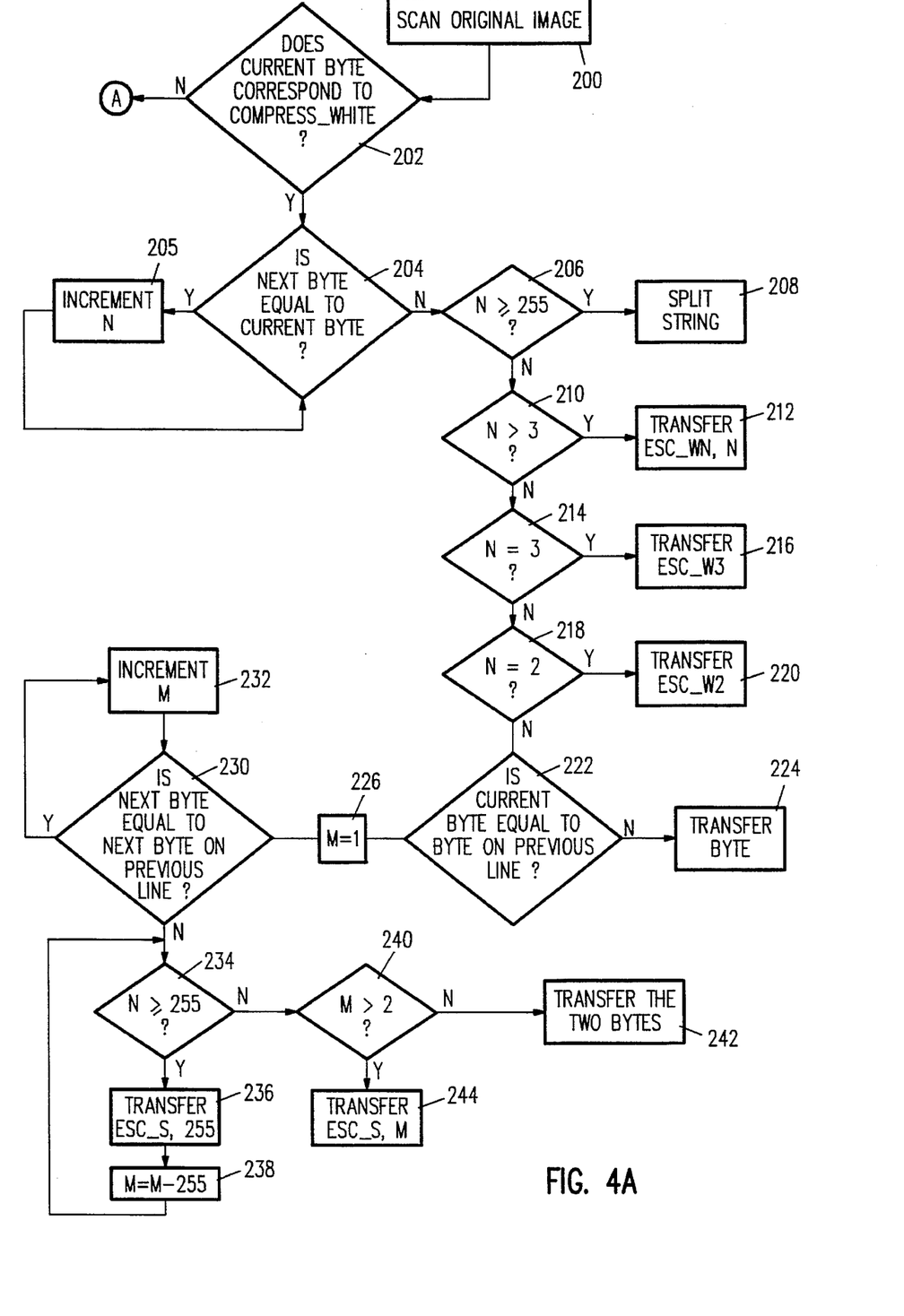
FIGS. 4A and 4B are flow charts showing a further embodiment of the invention which augments the one-dimensional compression of FIGS. 1 and 2 with a two-dimensional compression technique.
Figure 4B:
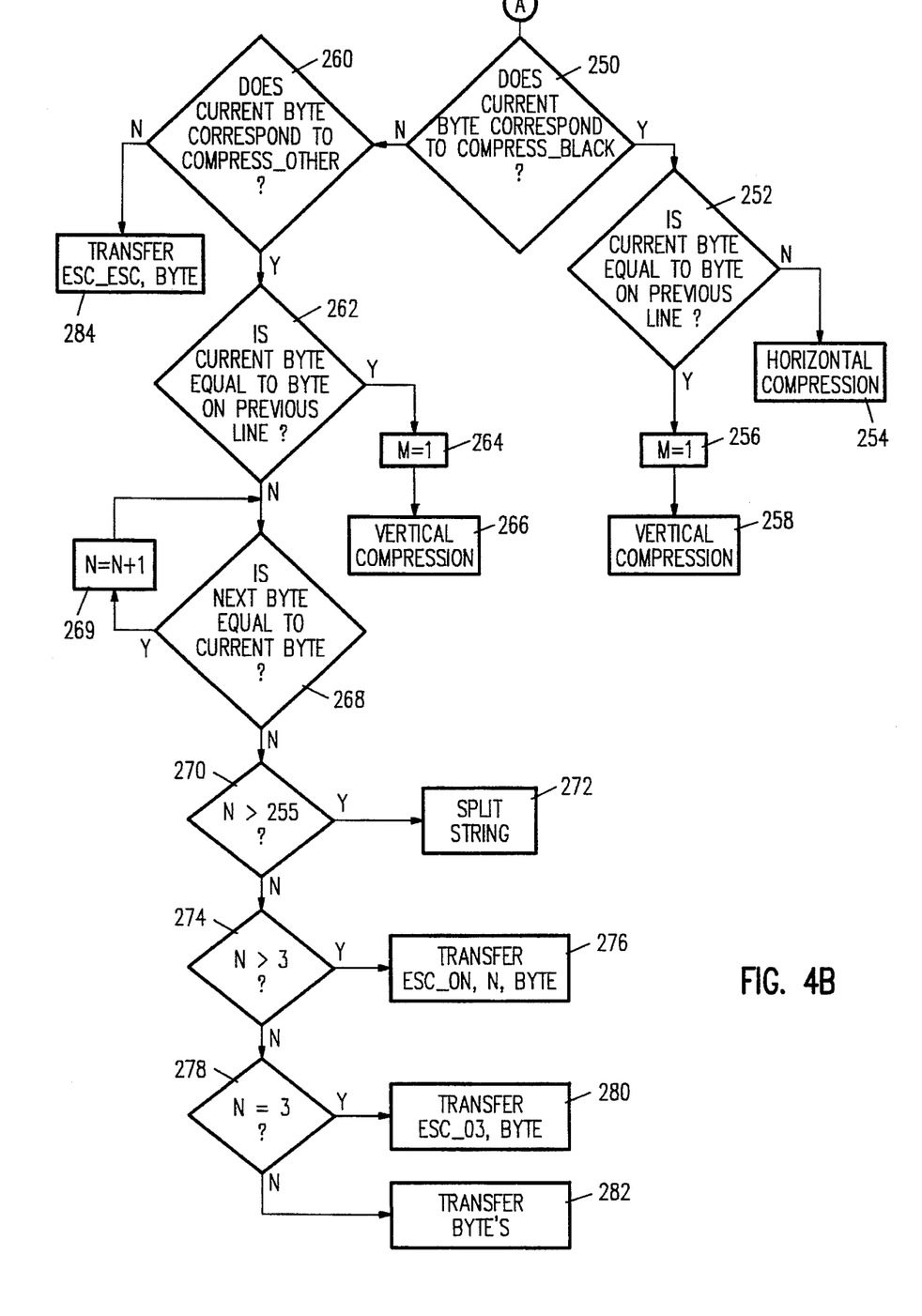

FIGS. 4A and 4B show a two-dimensional compression technique which is carried out as follows. The original image is scanned per step 200, and the current byte is checked per step 202 to determine whether its value corresponds to COMPRESS_WHITE. If it does, then steps 204, 205 and 206 determine whether the current byte is part of a string, obtain the length of the string, and check whether that length exceeds 255. These steps correspond to steps 4, 5 and 6 of FIG. 1. Steps 206, 208, 210, 212, 214, 216, 218 and 220 of FIG. 4A carry out a one-dimensional compression in the same way as is done with steps 6, 7, 9, 11, 13, 14, 15 and 17 of FIG. 1 which correspond respectively thereto.

The vertical component of the two-dimensional compression begins with step 222 which determines whether the current byte is equal to a byte lined up with it in the reference line. If it is not, then the BYTE is transferred, per step 224. If, however, there is equality between the current byte and the one just above it in the reference line, then step 226 sets the value of a counter M to 1. Step 230 then checks for correlation between the next byte and the one aligned with it in the reference line. If such equality exists, then the value of M is incremented by 1 per step 232, and the flow returns to step 230 to determine the length of the string, and so on. When the string terminates, step 230 will yield a negative result thereby directing the flow to step 234 which determines whether M exceeds 255. If it does, then the vertical compression is carried out by virtue of step 236 transferring two bytes namely, control byte ESC_S and the value of 255. Thus, Table 1 must be modified to include this control byte. After the transfer per step 236 is completed, step 238 reduces the value of M by the 255 bytes which have just been compressed, and the flow returns to step 234. This loop of steps 234, 236 and 238 continues until the value of M drops below 255. In that case, step 240 determines whether the value of M exceeds 2. If it does not, then the two bytes are transferred per step 242. If, however, the value of M is above 2, then step 244 transfers the control byte ESC_S together with the value of M. Since the control code ESC_S is indicative of a string of length M which is equal on both the current and the previous line, it is not necessary to also transfer the BYTE.

Returning now to step 202, if it determines that the current byte is not a COMPRESS_WHITE byte, then step 250 determines whether it is a COMPRESS_BLACK byte. If it is, then step 252 checks whether the current byte is the same as the byte in the reference line with which it is aligned. If not, then a one-dimensional (i.e. horizontal) compression is carried out. This is represented by box 254 which includes in it steps which are the same as those identified in FIG. 1 by numerals 24, 25, 26, 27, 29, 31, 33, 35, 37, 39 and 41. If, however, step 252 produces a positive result, then rather than carrying out the horizontal compression represented by box 254, a vertical compression is carried out with steps represented by box 258. First, however, the value of M is set to 1, per box 256, in order to indicate that the initial value of the string is 1. Box 258 represents steps 230, 232, 234, 236, 238, 240, 242 and 254 of FIG. 4A.

If step 250 yields a negative result, then step 260 checks whether the current byte is a COMPRESS_OTHER code. If it is, then step 262 checks whether the current byte is the same as the byte in the reference line with which it is aligned. If it is, then step 264 sets the value of M to 1, and box 266 represents a sequence of operations for carrying out vertical compression. More specifically, the same description is applicable to the sequence of operations of box 266 as has been provided above for boxes 254 and 258.

The use of boxes 254, 258 and 266 simplifies the description and describes the invention clearly and succinctly without cluttering the discussion with needless repetitions of steps that have previously been adequately explained.

If step 262 yields a negative result, a horizontal compression will be carried out. In particular, step 268 and 269 determine the length of the string, and step 270 determines whether the string exceeds 255 bytes. If it does, then box 272 represents the sequence of steps to split this string into groups of 255 which are compressed, as well as a remainder of 255 or less, as described above in connection with FIG. 3. If N is 255 or less, as determined by step 270, then step 274 determines whether N is greater than 3. If it is, then the data is compressed per step 276 by transferring the three bytes ESC_ON, the value of N, and the BYTE. If step 274 produces a negative result, then step 278 checks whether the value of N is exactly 3. If it is, then the data is compressed per step 280 by transferring the ESC_03 control byte and the BYTE. If, however, step 278 determines that the string has less than three bytes, then step 282 transfers the BYTE's unchanged.

Returning now to step 260, if the check for a COMPRESS OTHER code yields a negative result, this is combined with the negative results from steps 202 and 250 which led to 260, and means that the current byte is a control byte. In such a case, the control byte ESC_ESC is transferred followed immediately by the BYTE, per step 284. This is done for the same reasons as explained above in connection with step 48 of FIG. 1. Thus, no further details need to be provided.

It is apparent from the description of FIGS. 4A and 4B provided above that in response to a detection of a byte which corresponds to COMPRESS_WHITE, horizontal compression is attempted first, and then vertical compression. The reason for this is that such an approach improves the overall compression ratio when mixing text and pictures which have more white lines than white columns. However, for the COMPRESS_BLACK and COMPRESS_OTHER bytes, vertical compression is tried first and, if that is not possible, then horizontal compression is carried out. Whether horizontal compression or vertical compression is attempted first is a matter of choice depending on, for example, the nature of the image which is being compressed.

Decompression of the data which has been compressed per the steps shown in FIGS. 4A and 4B proceeds in a manner completely analogous to the decompression by the decompression steps of FIG. 2 of data compressed per the steps in FIG. 1. The compression/decompression table for two-dimensional data compression is Table 1 suitably modified to include all the needed control bytes, and this is self-apparent in view of the detailed explanations provided above regarding FIGS. 1 and 2.

The invention offers advantages in overcoming both drawbacks of the prior art which have been pointed out above. It offers superior performance while also achieving better compression when performed on complex, gray scale images.

Table 6 shows a size and performance comparison between MH compression and compression carried out in accordance with the invention. All results were measured on National Semiconductor's 25 Mhz NS32FX16 imaging signal processor evaluation board.

TABLE 6

| File | MH-size | MH-time | Invention-size | Invention-time |
|---|---|---|---|---|
| CCITT3 | 128,280 | 7.5 sec | 92,681 | 1.2 sec |
| FAMILY | 463,367 | 24.7 sec | 212,192 | 2.0 sec |
| PENCIL | 822,133 | 43.5 sec | 175,504 | 1.6 sec |

As can be seen from Table 6, it is possible to achieve more than an order of magnitude improvement in performance, while resulting in compression that is more than 4 times better.

The invention offers a method which is very efficient in both speed and storage requirements. It solves a real problem in every software based facsimile solution. Without this method, offering a "quick scan" capability would require a special hardware device, costing more money, board space, and development time.

In the description of the invention provided above, how data obtained from an original document is compressed has been explained by referring to the transfer of data. The word "transfer" is to be understood in the broad sense of transforming, changing and/or substituting the original data into compressed data.

Although preferred embodiments of the present invention have been described in detail above, various modifications thereto will be readily apparent to anyone with ordinary skill in the art. All such changes are intended to be within the scope of the present invention as defined by the following claims.

I claim:

1. Method for compression of data in the form of a sequence of data bits, comprising the steps of:

separating the data bits into groups of data bits of predetermined length;

determining a value for each of said groups of data bits derived from the data bits in such group;

determining whether the value derived for a particular group of data bits is equal to that of at least one group adjacent to the particular group and, if so, transferring compressed data bits representative of data in the particular group and in the at least one group consecutive with said particular group and having the same derived value.

2. The method for compressing data of claim 1, wherein said groups of data bits are of equal length.

3. The method for compressing data of claim 2, wherein said data bits are binary.

4. The method for compressing data of claim 3, wherein said groups of data bits are bytes.

5. The method for compressing data of claim 3, wherein the derived value of said groups is the binary value based on the type and sequence of bits in the groups of data bits, respectively.

6. The method for compressing data of claim 5, wherein said step of transferring compressed data includes the step of selecting a control code from a set of pre-assigned control codes.

7. The method for compressing data of claim 6, wherein at least one of said set of pre-assigned control codes is indicative of (a) whether the data bits in a group are all "0"s or all "1"s, and (b) the number of such consecutive groups.

8. The method for compressing data of claim 6, wherein at least one of said set of pre-assigned control codes is indicative of the number of consecutive groups having the same value.

9. The method for compressing data of claim 6, wherein said compressed data for groups of data bits which are other than groups having all "0"s or all "1"s include one of said set of pre-assigned control codes, data indicative of the number of consecutive groups having the same value, and data representing the data bits in each of such consecutive groups.

10. The method for compressing data of claim 9, wherein said set of pre-assigned control codes includes control codes having values respectively equal to some of the values of said groups of data bits and, when a derived value of a particular group equals a control code value, the data bits of the particular group are combined with a designated control code distinguishing such data bits from the incidence of any of the set of pre-assigned control codes.

11. The method for compressing data of claim 10, wherein said pre-assigned control codes are selected from among said groups of data bits which occur least frequently in the data.

12. The method for compressing data of claim 6, wherein said pre-assigned control codes are selected from among said groups of data bits which occur least frequently in the data.

13. The method for compressing data of claim 6, wherein said data bits are bitmapped in an array of rows and columns and the compressed data represents a horizontal compression of the data in each row.

14. The method for compressing data of claim 13, further comprising the step of vertically compressing data in a plurality of rows.

15. The method for compressing data of claim 14, wherein said step of vertically compressing data comprises the steps of comparing each row with its immediately previous row to identify common portions, and transferring compressed data including a pre-assigned control code indicative of the number of consecutive ones of said common portions.

16. The method for compressing data of claim 1, wherein said step of transferring compressed data includes the step of selecting a control code from a set of pre-assigned control codes.

17. The method for compressing data of claim 16, wherein at least one of said set of pre-assigned control codes is indicative of the number of consecutive groups having the same value.

18. The method for compressing data of claim 6, wherein said set of pre-assigned control codes includes control codes having values respectively equal to some of the values of said groups of data bits and, when a derived value of a particular group equals a control code value, the data of the particular group is combined with a control code distinguishing the incidence of such data from the incidence of any of the set of pre-assigned control codes.

19. The method for compressing data of claim 18, wherein said pre-assigned control codes are selected from among said groups of data bits which occur least frequently in the data.

20. The method for compressing data of claim 1, wherein said data bits are bitmapped in an array of rows and columns and the compressed data represents a horizontal compression of the data in each row.

21. The method for compressing data of claim 20, further comprising the step of vertically compressing data in a plurality of rows.

22. The method for compressing data of claim 21, wherein said step of vertically compressing data comprises the steps of comparing each row with its immediately previous row to identify common portions, and transferring compressed data including a pre-assigned control code indicative of the number of consecutive ones of said common portions.

23. Method for compression of data in the form of a sequence of data bits, comprising the steps of:

separating the data bits into groups of data bits;

providing a plurality of categories for values of said groups derivable from the data bits in the respective groups, said categories being indicative of the type of data in such groups;

for each of such categories, pre-assigning a set of control codes indicative of at least one of (a) the data contained in such groups, and (b) the number of consecutive groups having the same derived value; and substituting for data bits in a plurality of consecutive groups of data bits compressed data that includes one of said set of pre-assigned codes which corresponds to the occurrence of consecutive groups of data bits that fit within the same one of said categories.

24. The method for compressing data of claim 23, wherein the data is binary data, and wherein said categories include one category of all "0"s groups and one category of all "1"s groups.

25. The method for compressing data of claim 24, wherein said categories include one category of groups that are neither all "0"s nor all "1"s.

26. The method for compressing data of claim 25, wherein said step of substituting compressed data includes the step of determining a value for each of said groups of data bits derived from the data bits in such group, identifying to which one of said plurality of categories such derived value belongs, and designating one of said set of pre-assigned codes to represent a plurality of consecutive groups of data bits based on the identified category.

27. The method for compressing data of claim 26, wherein said designating step includes the steps of determining whether the derived values for a number of consecutive groups of data bits are equal to each other and, if so, designating said one pre-assigned code to indicate such number.

28. The method for compressing data of claim 27, wherein said one designated pre-assigned code is indicative of such number of consecutive groups of data bits having the same derived value, and of the data bits contained in each of such consecutive groups.

29. The method for compressing data of claim 26, wherein said step of substituting compressed data includes the steps of determining whether the derived values for a number of consecutive groups of data bits are equal to each other and, if so, forming said compressed data from said one designated pre-assigned code, a signal indicative of such number of consecutive groups, and the data bits in each of such consecutive groups.

30. Apparatus for compression of data in the form of a sequence of data bits, comprising:

means for separating the data bits into groups of data bits of predetermined length;

means for determining a value for each of said groups of data bits derived from the data bits in such group;

means for determining whether the value derived for a particular group of data bits is equal to that of at least one group adjacent to the particular group; and transfer means responsive to said determining means for transferring compressed data representative of data bits in the particular group and in the at least one group consecutive with said particular group and having the same derived value.

31. Apparatus for compression of data in the form of a sequence of data bits, comprising:

means for separating the data bits into groups of data bits;

means for providing a plurality of categories for values of said groups derivable from the data bits in the respective groups, said categories being indicative of the type of data in such groups;

means for pre-assigning a set of control codes, for each of such categories, indicative of at least one of (a) the data contained in such groups, and (b) the number of consecutive groups having the same derived value; and means for substituting for data bits in a plurality of consecutive groups of data bits compressed data that includes one of said set of pre-assigned codes which corresponds to the occurrence of consecutive groups of data bits that fit within the same one of said categories.

32. The apparatus for compressing data of claim 31, wherein said transfer means includes means for determining a value for each of said groups of data bits derived from the data bits in such group, means for identifying to which one of said plurality of categories such derived value belongs, and means for designating one of said set of pre-assigned codes to represent a plurality of consecutive groups of data bits based on the identified category.

33. The apparatus for compressing data of claim 32, wherein said designating means includes means for determining whether the derived values for a number of consecutive groups of data bits are equal to each other and, if so, for designating said one pre-assigned code to indicate such number.

34. The apparatus for compressing data of claim 32, wherein said transfer means includes means for determining whether the derived values for a number of consecutive groups of data bits are equal to each other and, if so, for forming said compressed data from said one designated pre-assigned code, a signal indicative of such number of consecutive groups, and the data bits in each of such consecutive groups.

* * * * *